(12) United States Patent
Mucha et al.

(10) Patent No.: US 10,727,798 B2
(45) Date of Patent: Jul. 28, 2020

(54) METHOD FOR IMPROVING DIE AREA AND POWER EFFICIENCY IN HIGH DYNAMIC RANGE DIGITAL MICROPHONES

(71) Applicant: INVENSENSE, INC., San Jose, CA (US)

(72) Inventors: Igor Mucha, Bratislava (SK); Michael Perrott, Nashua, NH (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 16/543,276

(22) Filed: Aug. 16, 2019

(65) Prior Publication Data

US 2020/0059214 A1 Feb. 20, 2020

Related U.S. Application Data

(60) Provisional application No. 62/765,085, filed on Aug. 17, 2018.

(51) Int. Cl.
| | |
|---|---|
| *H03G 3/30* | (2006.01) |
| *H03F 3/68* | (2006.01) |
| *H04R 3/04* | (2006.01) |
| *H04R 29/00* | (2006.01) |

(52) U.S. Cl.
CPC .............. *H03G 3/3005* (2013.01); *H03F 3/68* (2013.01); *H04R 3/04* (2013.01); *H04R 29/004* (2013.01); *H03F 2200/03* (2013.01); *H03F 2200/165* (2013.01); *H03F 2200/171* (2013.01); *H03F 2200/375* (2013.01); *H03G 2201/103* (2013.01)

(58) Field of Classification Search
USPC ..... 381/57, 91, 92, 104, 107, 119, 120, 122, 381/123
See application file for complete search history.

(56) References Cited

U.S. PATENT DOCUMENTS

| | | |
|---|---|---|
| 5,389,927 A | 2/1995 | Turney et al. |
| 6,255,974 B1 | 7/2001 | Morizio et al. |
| 6,333,707 B1 | 12/2001 | Oberhammer et al. |
| 6,445,320 B1 | 9/2002 | Noro et al. |
| 7,327,294 B2 | 2/2008 | Gierenz et al. |
| 9,673,768 B2 | 6/2017 | Perrott |
| 2003/0078007 A1 | 4/2003 | Parssinen et al. |

(Continued)

OTHER PUBLICATIONS

Office Action dated Sep. 22, 2016 for U.S. Appl. No. 14/812,576, 23 pages.

(Continued)

*Primary Examiner* — Yosef K Laekemariam
(74) *Attorney, Agent, or Firm* — Amin, Turocy & Watson, LLP

(57) ABSTRACT

Exemplary multipath digital microphones described herein can comprise exemplary embodiments of automatic gain control and multipath digital audio signal digital signal processing chains, which allow low power and die size to be achieved as described herein, while still providing a high DR digital microphone systems. Further non-limiting embodiments can facilitate switching between multipath digital audio signal digital signal processing chains while minimizing audible artifacts associated with either the change in the gain automatic gain control amplifiers switching between multipath digital audio signal digital signal processing chains.

27 Claims, 9 Drawing Sheets

(56) References Cited

U.S. PATENT DOCUMENTS

| | | |
|---|---|---|
| 2006/0071835 A1 | 4/2006 | Inukai |
| 2006/0097899 A1 | 5/2006 | Nagai |
| 2006/0220935 A1 | 10/2006 | Hughes et al. |
| 2008/0137784 A1 | 6/2008 | Krone |
| 2008/0272950 A1 | 11/2008 | Eastty et al. |
| 2009/0161883 A1* | 6/2009 | Katsianos ............ H03G 9/005 381/57 |
| 2011/0026739 A1 | 2/2011 | Thomsen et al. |
| 2011/0029109 A1 | 2/2011 | Thomsen et al. |
| 2012/0033817 A1 | 2/2012 | Francois et al. |
| 2012/0229316 A1 | 9/2012 | Loeda et al. |
| 2013/0195291 A1 | 8/2013 | Josefsson |
| 2014/0010374 A1 | 1/2014 | Kasai et al. |
| 2014/0086433 A1 | 3/2014 | Josefsson |
| 2014/0133677 A1* | 5/2014 | Zerbini ................ H04R 19/005 381/119 |
| 2014/0140538 A1* | 5/2014 | Kropfitsch ............ H03G 3/002 381/106 |
| 2015/0124981 A1 | 5/2015 | Veneri et al. |
| 2015/0237432 A1 | 8/2015 | Miluzzi et al. |

OTHER PUBLICATIONS

Notice of Allowance dated Feb. 3, 2017 for U.S. Appl. No. 14/812,576, 15 pages.
Office Action dated Apr. 1, 2020 for U.S. Appl. No. 16/673,484, 39 pages.

\* cited by examiner

METHOD FOR IMPROVING DIE AREA AND POWER EFFICIENCY IN HIGH DYNAMIC RANGE DIGITAL MICROPHONES

PRIORITY CLAIM

This patent application is a Non-Provisional Application that claims priority to U.S. Provisional Patent Application Ser. Number: 62/765,085, filed Aug. 17, 2018, entitled "A METHOD FOR IMPROVING DIE AREA AND POWER EFFICIENCY IN HIGH DYNAMIC RANGE DIGITAL MICROPHONES," the entirety of which is incorporated by reference herein.

TECHNICAL FIELD

The subject disclosure relates to digital microphones and, more specifically, to multipath digital microphone implementations.

BACKGROUND

Microphones can be exposed to environments where sound levels, described on a log scale using units of decibels of sound pressure level (dB SPL), can range from very quiet (e.g., less than 25 dB SPL) to very loud (e.g., 140 dB SPL). In addition, microphones are typically required to maintain their performance over a large signal range, e.g., up to 120 dB. Simultaneously, microphones are required to exhibit very small intrinsic noise in order to make weak audio signals detectable, while they also need to handle very large audio signals without significant distortion. As a result, such requirements dictate that microphones have a very large dynamic range (DR).

Analog and digital microphones output a voltage or digital output stream, respectively, corresponding to the audio signal sensed by the microphone. The advantage of a digital microphone is that its digital output stream is relatively immune to noise and that an analog-to-digital converter (ADC) is not required to perform digital signal processing on the microphone digital output stream. However, one disadvantage of a digital microphone is that its dynamic range is often lower than what can be achieved with an analog microphone due to constraints in the power consumption and or die size or area that can be allocated to the microphone within many applications.

Conventional solutions for improving DR of a digital microphone can include techniques such as employing one or more of a high DR ADC or employing an automatic gain control amplifier (AGC) which can significantly lower ADC DR requirements while still meeting the desired max SPL and noise floor levels of the overall digital microphone. However, such conventional solutions can require excessively large power consumption, die area, and/or introduce troublesome artifacts.

In addition, the ability to integrate a high DR digital microphone is desirable for implementation in devices such as mobile devices that can be exposed to a variety of widely varying SPL environments. For example, a digital microphone comprising one or more microelectromechanical systems (MEMS) acoustic sensors with a component implementing an algorithm for high DR in complementary metal oxide semiconductor (CMOS) processes can provide a low power, high DR digital microphone suitable for such mobile devices. However, as the demands for consumer electronics trends toward smaller, mobile, and more feature-rich devices, the need for a high DR, digital, feature-rich microphone continues to confront continued demand for smaller and more power efficient devices. Thus, a low-power, compact, high DR digital microphone digital microphone remains a challenge.

It is thus desired to provide high dynamic range digital microphones that improve upon these and other deficiencies. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, an exemplary multipath digital microphone is described. The exemplary multipath digital microphone described herein can comprise exemplary embodiments of multipath digital microphones employing automatic gain control, which allow low power and die area to be achieved for amplifiers or gain stages in exemplary multipath digital microphone arrangements described herein, while still providing high DR digital microphone systems. Exemplary multipath digital microphones described herein can comprise exemplary embodiments of automatic gain control and multipath digital audio signal digital signal processing chains, which allow low power and die size to be achieved as described herein, while still providing a high DR digital microphone systems. Further non-limiting embodiments can facilitate switching between multipath digital audio signal digital signal processing chains while minimizing audible artifacts associated with either the change in the gain automatic gain control amplifiers switching between multipath digital audio signal digital signal processing chains Accordingly, an exemplary multipath digital microphone can comprise an automatic gain control (AGC) component configured to determine and adjust gain for each of a plurality of amplifiers based at least in part on a characteristic measurement of an associated audio signal in the multipath digital audio signal digital signal processing chains. Furthermore, exemplary multipath digital microphone systems can comprise a multipath digital audio combiner component comprising a multiplexing component configured to switch from conveying one corrected digital audio signal to conveying a second corrected digital audio, after performing gain and/or offset correction to provide the corrected digital audio signals.

In a further non-limiting aspect, exemplary methods and systems associated with multipath digital microphone systems are described.

These and other embodiments are described in more detail below.

BRIEF DESCRIPTION OF THE DRAWINGS

Various non-limiting embodiments are further described with reference to the accompanying drawings, in which.

DETAILED DESCRIPTION

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

According to various described embodiments, the subject disclosure provides digital microphones, systems, and methods for multipath digital microphones. For instance, as described above, a digital microphone outputs a digital output signal corresponding to an audio signal sensed by the microphone. While a digital microphone is relatively immune to noise and does not require an ADC on its output stream, the dynamic range can be lower than what can be achieved with an analog microphone unless constraints in the microphone power consumption for particular applications can be met. As the demands for consumer electronics trends toward smaller, mobile and more feature-rich devices, the need for a high DR, digital, feature-rich microphone continues to confront continued demand for smaller and more power efficient devices.

Figure 1:
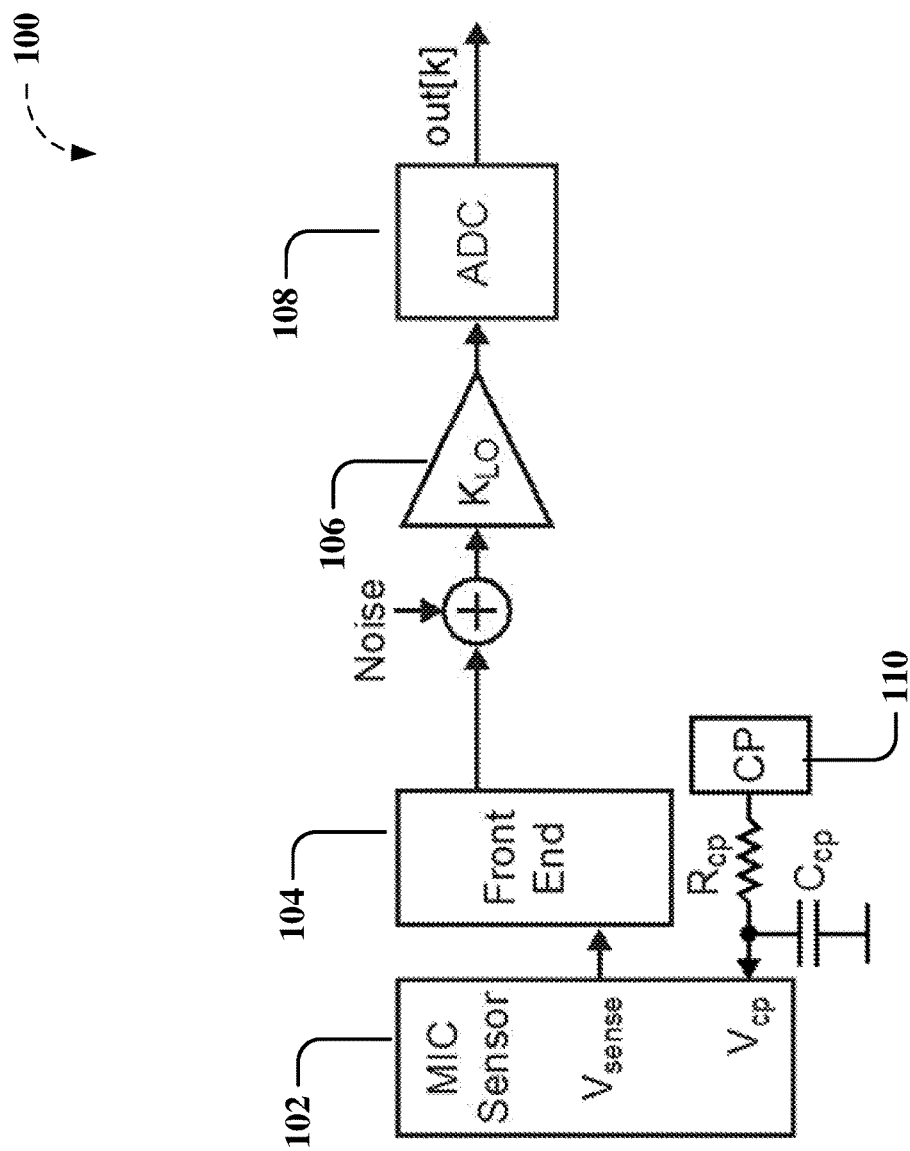
FIG. 1 depicts a functional block diagram of an exemplary operating environment suitable for incorporation of various non-limiting aspects of the subject disclosure.

FIG. 1 depicts a functional block diagram of an exemplary operating environment 100 suitable for incorporation of various non-limiting aspects of the subject disclosure. As a non-limiting example, an exemplary operating environment 100 can comprise one or more exemplary microelectromechanical systems (MEMS) acoustic or microphone sensors 102 (e.g., one or more of MEMS acoustic or microphone sensor, etc.). In various embodiments, exemplary systems are depicted as comprising one MEMS acoustic or microphone sensor 102, whereas other exemplary systems can be described as comprising more than one MEMS acoustic or microphone sensors 102. It can be appreciated that the various MEMS acoustic or microphone sensors 102 need not be identical in design, fabrication, characteristic, and/or placement, etc., and according to a non-limiting aspect, the one or more exemplary MEMS acoustic or microphone sensors 102 vary in one or more of the forgoing aspects. In a non-limiting aspect, the one or more of MEMS acoustic or microphone sensors 102 can be configured to receive one or more of the acoustic signal or a variation associated with the acoustic signal (e.g., such as the acoustic signal varied by differences in time, location, acoustic path, etc.) or can be comprised of any number of disparate transducer structures (e.g., numbers and/or configuration of membranes, etc.), any number of front end circuit designs (e.g., supplying variable charge pump voltages, etc.), etc., for example.

The one or more MEMS acoustic or microphone sensors 102 can be configured to receive one or more acoustic signals, and can be operatively coupled to one or more components or circuitry 104 (e.g., one or more components or circuitry 104, etc., sometimes referred to, herein, as, "front end") configured to process one or more electrical signals (e.g., one or more electrical signals associated with one or more of MEMS acoustic or microphone sensor, etc.) that vary in accordance with the one or more acoustic signals to create one or more corresponding processed electrical signal (e.g., at one or more outputs of the one or more components or circuitry 104, etc.).

In a further non-limiting example, an exemplary operating environment 100 can comprise one or more exemplary amplifier or gain stage 106 (e.g., one or more amplifier or gain stage 106, etc.) operatively coupled to the one or more output associated with the one or more components or circuitry 104 (e.g., one or more of components or circuitry 104, etc.). In a non-limiting aspect, the one or more amplifier or gain stage 106 can be configured to receive the one or more corresponding processed electrical signals and/or apply one or more scaling factors (e.g., one or more analog scaling factors) to the one or more corresponding processed electrical signals via an exemplary automatic gain control (AGC) component (not shown), for example, as further described herein, regarding FIGS. 2-9.

In addition, exemplary operating environment 100 can further comprise one or more exemplary ADCs 108 operatively coupled to one or more outputs associated with the one or more amplifier or gain stage 106, as further described herein, regarding FIGS. 2-9. In another non-limiting aspect, the one or more exemplary ADCs 108 can be configured to provide one or more digital audio signals having different digital scaling factors associated with the one or more acoustic signals (e.g., at outputs associated with the one or more ADCs 108, etc.). In a further non-limiting aspect, the one or more components or circuitry 104 can comprise or be associated with one or more adjustable direct current (DC) bias voltage circuit operatively coupled to the one or more of MEMS acoustic or microphone sensors 102 and can be configured to adjust one or more DC bias voltage provided to the one or more of MEMS acoustic or microphone sensors 102, respectively, e.g., via one or more charge pump 110.

Figure 2:
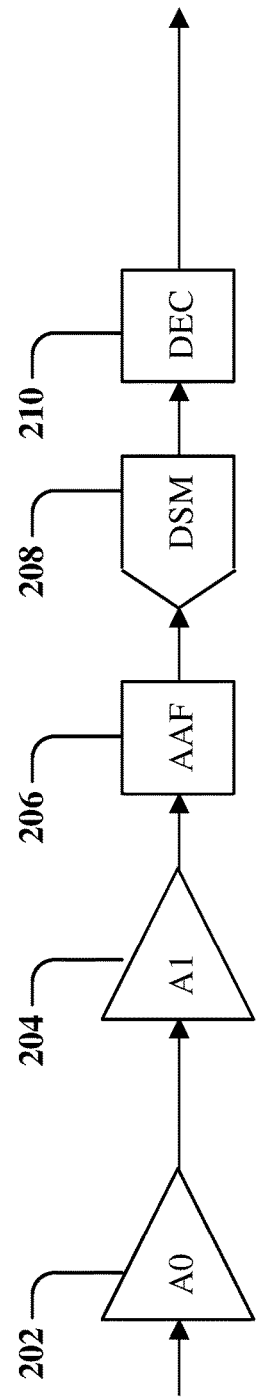
FIG. 2 depicts another exemplary operating environment illustrating non-limiting aspects of the disclosed subject matter.

FIG. 2 depicts another exemplary operating environment 200 illustrating non-limiting aspects of the disclosed subject matter. Accordingly, exemplary operating environment 200 can comprise signal processing blocks of a typical application specific integrated circuit (ASIC) for a digital microphone, and can typically comprise input buffer A0 202, amplifier, gain stage or preamp A1 204, anti-aliasing filter (AAF) 206, an ADC 108 such as a delta-sigma modulator (DSM) 208, and decimation filter (DEC) 210. In a non-limiting aspect, exemplary input buffer A0 202 can be an input buffer or impedance converter that converts the high impedance or capacitance input from the MEMS microphone to a low impedance output. In further non-limiting aspect, exemplary anti-aliasing filter 206 can comprise a filter (e.g., a low pass filter, a decimation filter, etc.) to remove frequencies that are too close to sampling frequency of the ADC, e.g., delta-sigma modulator 208.

Specifications for low noise, high signal to noise ratio (SNR), acoustic overload point AOP and so on drive designs to limit power and space, while still providing high performance digital microphones, as further described herein. For example, to improve noise or SNR of the digital microphone by 6 decibel (dB), or a factor of two, the power consumption and area of blocks in the signal chain are increased by a factor of four. As another non-limiting example, sacrifices in area of the anti-aliasing filter 206 and area and power in the ADC 108 such as a delta-sigma modulator 208 requires a gain as high as possible gain of amplifier, gain stage or preamp A1 204, which can reduce the acoustic overload point (AOP).

Similarly, in order to improve dynamic range without the negative effects of increasing supply current, power consumption, or area, various embodiments described herein can employ adjustment of the gain in accordance with signal levels, rather than employing simple linear processing in the signal chain. Two conventional approaches have employed either AGC or multipath digital signal processing signal chains, each with their attendant drawbacks.

Accordingly, in various non-limiting embodiments, automatic gain control (AGC) and multipath digital signal processing can be employed to provide high performance digital microphones without the negative impacts on die area and power consumption, as described above. In a non-limiting aspect, one signal path in a multipath digital signal processing signal chain can be employed to process low sound pressure level (SPL) signals (e.g., higher gain in A1 204), whereas another signal path in the multipath digital signal processing signal chain can be employed to process high sound pressure level signals (e.g., lower gain in A1 204). In further non-limiting aspects, it can be understood that, higher gain in A1 204 in the low sound pressure level digital signal processing signal chain can relax the design specifications (e.g., allowing for lower power and area) in an exemplary ADC such as a delta-sigma modulator (DSM) 208 and AAF 206 in the low sound pressure level digital signal processing signal chain, whereas the lower gain in A1 in the high sound pressure level digital signal processing signal chain can result in higher noise in the high sound pressure level digital signal processing signal chain, but with the ability to provide a more efficient high performance digital microphone without the negative impacts on die area and power consumption.

Thus, it can be understood that in power and size optimized linear high dynamic range systems, any further improvement of dynamic range requires a corresponding increase of power consumption, where improved dynamic range of digital microphones can employ multi-path signal processing and increasing power supply for blocks processing high dynamic range signals. To make the power supply and occupied die area less dependent on the dynamic range, non-linear signal processing, such as multipath or automatic gain control systems can be implemented, where the largest and most power consuming blocks (e.g., filters, ADCs, etc.) process a signal with much less dynamic range than required by the application, thus, saving a substantial amount of die area and power. Multipath signal processing may require more chip area and power consumption, and as further described herein. On the other hand, AGC methods typically require less area and power, but their usage is limited to high sound pressure levels, where the sound masks audible artifacts, such as harmonic distortion caused by non-linear signal processing and non-ideal matching of analog and digital signal processing block counterparts, or glitches during gain switching caused by non-infinite bandwidth, mismatches of gains and DC offsets or just a too large difference of noise levels, so that these artifacts become inaudible for human hearing.

As described, in low noise digital microphones, the largest and most power consuming blocks are typically filters and ADCs. Accordingly, various embodiments as described herein can be configured to amplify the signal in front of these blocks as much as possible and attenuate it after them. For instance, by combining multipath digital signal processing signal chain employing automatic gain control at the gain stages, solutions can be designed that take advantages of the benefits of both, while minimizing the negative impacts of either.

Figure 3:
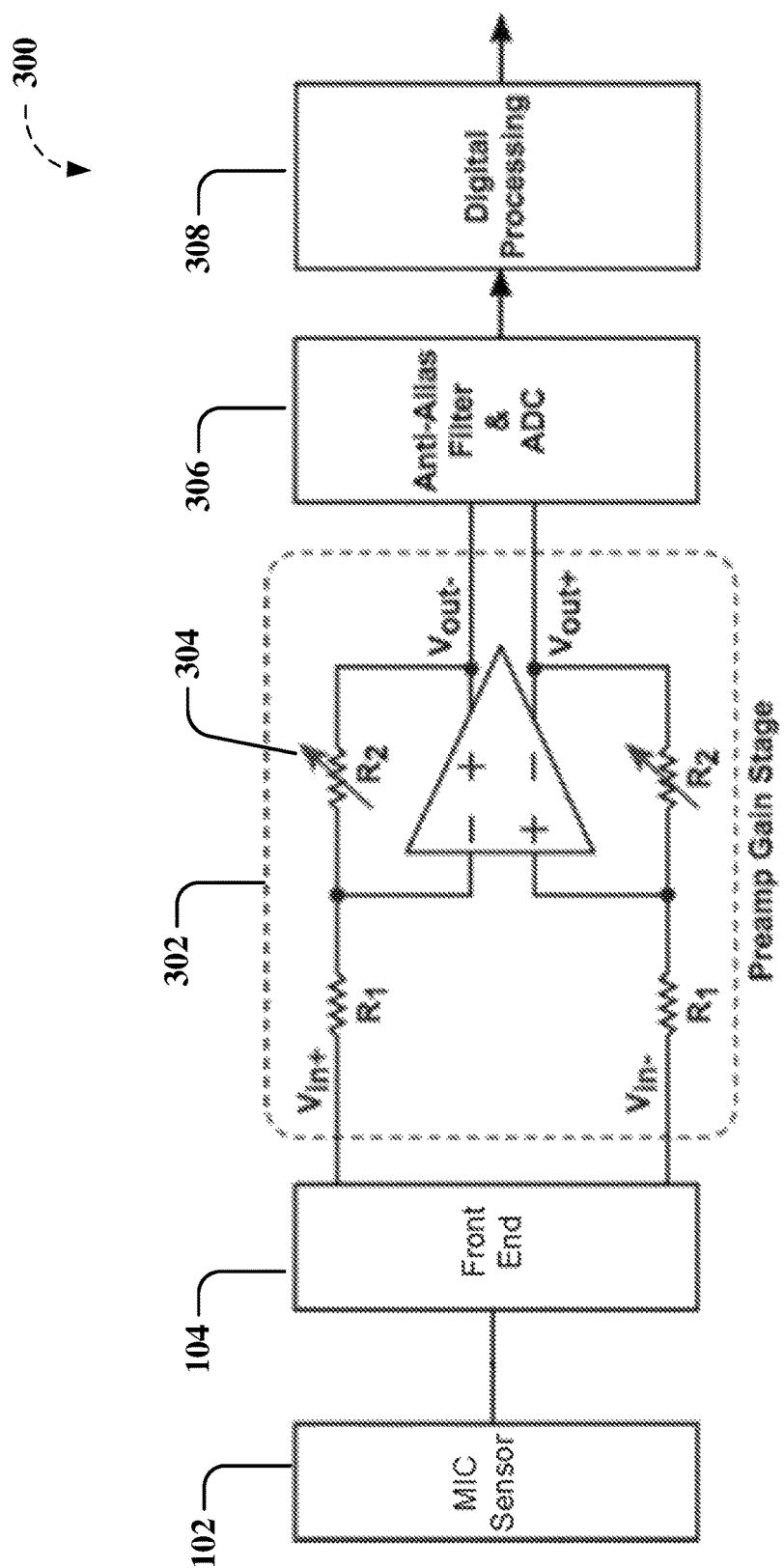
FIG. 3 depicts a non-limiting block diagram of exemplary aspects of an embodiment of automatic gain control, according to various embodiments described herein.

FIG. 3 depicts a non-limiting block diagram 300 of exemplary aspects of an embodiment of automatic gain control, according to various embodiments described herein. For example, as described above regarding FIG. 1, one or more exemplary MEMS acoustic or microphone sensors 102 can be operatively coupled to one or more components or circuitry 104 or front end. The one or more exemplary MEMS acoustic or microphone sensors 102 can be operatively coupled to a respective gain stage or preamp A1 204 comprising automatic gain controlled gain stage or preamp 302, which gain can be adjusted, in a non-limiting example by varying the resistance (e.g., of a switched resistor network (not shown) variable resistor $R_2$ 304. In further non-limiting aspect, output of gain stage or preamp A1 204 comprising automatic gain controlled gain stage or preamp 302 can be processed according to the embodiment described in FIG. 2 (e.g., AAF and ADC 306), and further digital signal processing 308 (e.g., digital gain compensation, etc.), or as further described herein.

As can be seen in FIG. 3, some benefits of employing automatic gain control can include the simplicity of design of a single channel or signal processing chain, which requires only one preamp or gain stage and one ADC, which allows higher gain before ADC 108 such as DSM 208, so that lower ADC noise can be achieved. This further allows for dramatic power reduction (e.g., lower supply current) of the ADC and allows for lower die area. In addition, various embodiments employing automatic gain control can allow for ease of digital gain compensation. However, at gain transitions, potential glitches can arise. For instance, audible glitches can arise due to one or more of mismatches between analog and digital gain, difficulties in analog offset compensation, and/or the finite bandwidth of analog signal processing blocks that limits how fast analog and digital blocks can react to gain switches in the system. In addition, preamp or gain stage power can be relatively high.

Thus, in further non-limiting aspects, various embodiments described herein can employ small gain steps of approximately 6 dB in AGC gain transitions such that digital gain compensation can mitigate or eliminate potential glitches.

Figure 4:
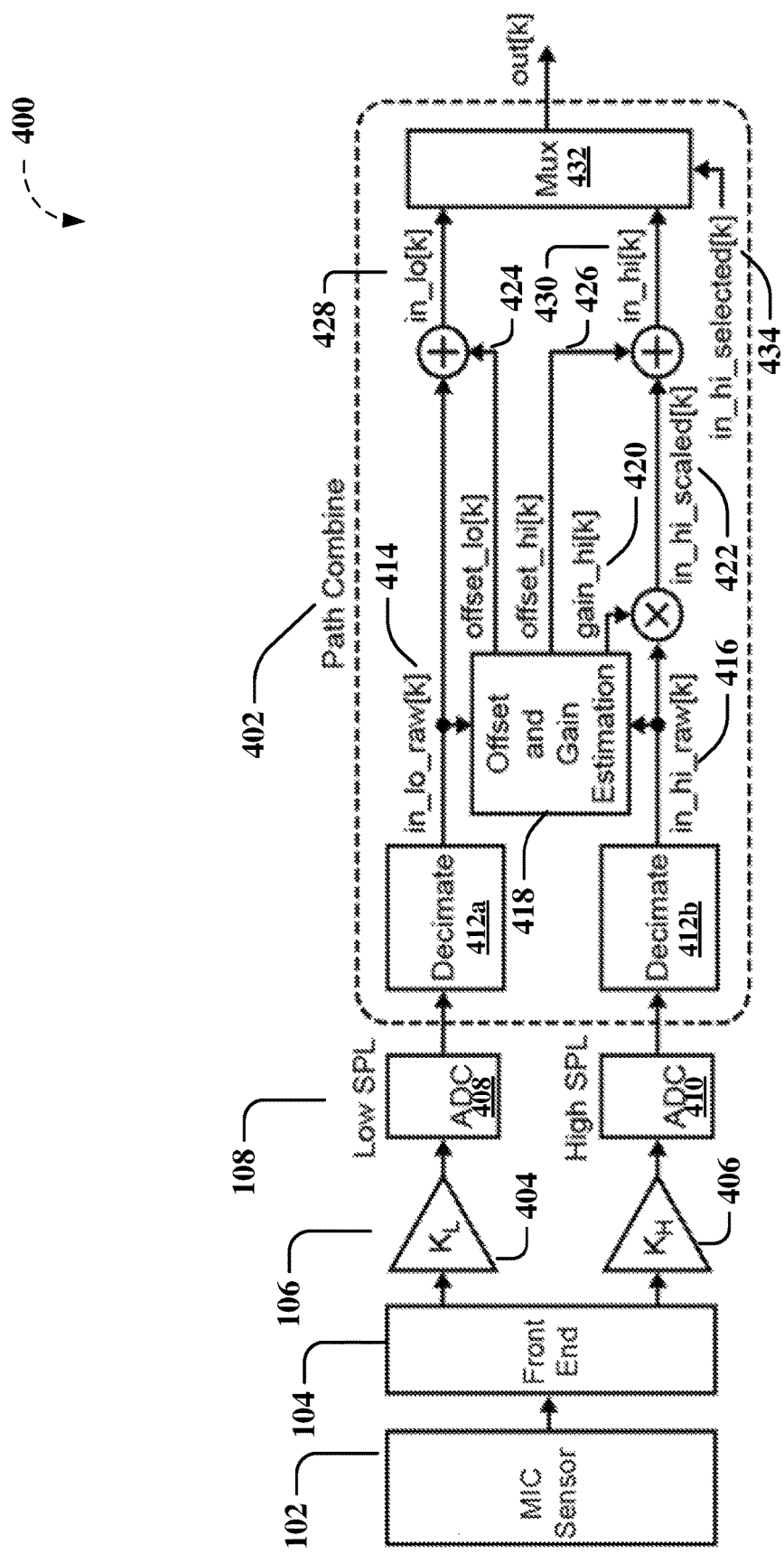
FIG. 4 depicts a non-limiting block diagram of exemplary aspects of multipath digital signal processing signal chain, according to various non-limiting embodiments.

FIG. 4 depicts a non-limiting block diagram 400 of exemplary aspects of multipath digital signal processing signal chain, according to various non-limiting embodiment. U.S. Pat. No. 9,673,768 describes multipath digital microphone systems comprising a multipath digital audio combiner component, the entirety of which is herein incorporated by reference. As a non-limiting example, FIG. 4 depicts a functional block diagram of an exemplary digital microphone system comprising a non-limiting implementation of a two-path digital combiner audio combiner component 402 according to aspects of the subject disclosure. For instance, as described above regarding FIG. 1, exemplary digital microphone system can comprise one or more exemplary MEMS acoustic or microphone sensors 102 (e.g., one or more MEMS acoustic or microphone sensor 102, etc.), operatively coupled to one or more components or circuitry 104 (e.g., one or more components or circuitry 104, etc.), or front end, one or more exemplary amplifiers or gain stages 106 (e.g., one or more of amplifiers or gain stages 106, etc.) operatively coupled to the one or more output associated with the one or more components or circuitry 104 (e.g., one or more components or circuitry 104, etc.), one or more exemplary ADCs 108 (e.g., one or more ADC 108, etc.) operatively coupled to one or more outputs associated with the one or more amplifiers or gain stages 106. In addition, exemplary digital microphone system can further comprise an exemplary multipath digital audio combiner component 402 operatively coupled to one or more outputs associated with the one or more ADCs 108 (e.g., outputs associated with the one or more ADC 108, etc.). In addition, unlike in an AGC approach (e.g., adjusting analog scaling factors prior to the ADC), these gain values, $K_{HI}$ and $K_{LO}$, are described in U.S. Pat. No. 9,673,768 as nominally static rather than varying according to the input signal levels (though their values may be changed under different operating modes of the digital microphone), in a further non-limiting aspect. For instance, rather than changing a gain value according to the input audio signal level as done in AGC systems, an exemplary multipath digital audio combiner component 210, as described in U.S. Pat. No. 9,673,768, can be configured to select an ADC output from the Low SPL path or the High SPL path according to an input audio signal level.

As a further non-limiting example, for small input audio signal levels, the Low SPL path output can be chosen (e.g., by exemplary multipath digital audio combiner component 402 or portions thereof) for output to exemplary path combiner output, out[k], but when the input audio signal level is close to exceeding the Max SPL range of the Low SPL path, exemplary multipath digital audio combiner component 402 can be further configured to select the High SPL path for output to exemplary path combiner output, out[k].

In the non-limiting example shown in FIG. 4, it is assumed that the High SPL path ADC (e.g., corresponding to exemplary ADC 208 as described in FIG. 2) is designed to have worse noise than the Low SPL path ADC (e.g., exemplary ADC 206), which allows the High SPL path ADC (e.g., corresponding to exemplary ADC 208 as described in FIG. 2) to be implemented with significantly lower power consumption than the Low SPL path ADC (e.g., corresponding to exemplary ADC 206 as described in FIG. 2). However, due to the higher ADC noise and reduced amplifier gain in the High SPL path (e.g., corresponding to exemplary ADC 206 as described in FIG. 2), the noise floor increases when sending the High SPL path (e.g., corresponding to exemplary amplifier or gain stage 204 and exemplary ADC 208 as described in FIG. 2) to the overall microphone output (e.g., exemplary path combiner output, out[k]) rather than the Low SPL path Low SPL path (e.g., corresponding to another exemplary amplifier or gain stage 202 and exemplary ADC 206 as described in FIG. 2). It can be understood that this increase in noise floor will be acceptable for many audio applications since the High SPL path (e.g., corresponding to exemplary amplifier or gain stage 204 and exemplary ADC 208 as described in FIG. 2) is only activated when large audio signals occur. Thus, the overall digital microphone as depicted regarding exemplary digital microphone system is able to achieve a large DR without requiring a large DR ADC, which, in turn, enables a relatively low power digital microphone implementation that can achieve similar DR, for example, as an analog microphone as described in U.S. Pat. No. 9,673,768.

For instance, as described above, exemplary digital microphone system of FIG. 4 is depicted as digital two-path microphone system that can employ a single MEMS acoustic or microphone sensor 102 and a single front end 104 coupled to a Low SPL path (e.g., comprising exemplary preamplifier/gain stage 404 and exemplary ADC 408) and a High SPL path (e.g., comprising exemplary preamplifier/gain stage 406 and exemplary ADC 410), with the outputs of exemplary ADC 408 and ADC 410 coupled to exemplary multipath digital audio combiner component 402, which provides an exemplary path combiner output, out[k].

In a non-limiting aspect, exemplary digital microphone system can comprise exemplary ADC 408 and ADC 410 employing a Delta-Sigma (Δ-Σ) architecture, in which the sample rate of the ADC is much higher than the bandwidth of the audio signal, and in which a significant amount of high frequency quantization noise can be present in the ADC output (e.g., output of exemplary ADC 408 and ADC 410). As further described above, exemplary multipath digital audio combiner component 402 can comprise one or more of digital audio filters 202 (e.g., one or more of digital audio filters 206a, 206b, . . . , 206n, etc.) operatively coupled to one or more exemplary ADCs 108 (e.g., one or more of ADC 108a, 108b, . . . , 108n, etc., such as DSM 208). As described herein, the one or more of digital audio filters 206 can be configured to receive one or more of digital audio signals having different scaling factors of an associated audio signal and can be configured to provide one or more of filtered digital audio signals, as described herein. Accordingly, in a further non-limiting aspect, the one or more of digital audio filters 206 can comprise one or more decimators 412 (e.g., decimator 412a, 412b, etc.). Thus, exemplary digital microphone system comprising an exemplary multipath digital audio combiner component 402 can comprise one or more exemplary decimators 412 (e.g., decimator 412a, 412b, etc.) configured to reduce the impact of Δ-Σ quantization noise. In further non-limiting aspect, the one or more exemplary decimators 412 (e.g., decimator 412a, 412b, etc.) can also lower the clock rate of path combine digital circuits associated with exemplary multipath digital audio combiner component 402. As a result, outputs of exemplary ADC 408 and ADC 410 can be decimated to produce signals in_lo_raw[k] (414) and in_hi_raw[k] (416) as indicated in FIG. 4.

As further described in U.S. Pat. No. 9,673,768, exemplary multipath digital audio combiner component 402 can comprise an exemplary gain and offset estimation component 418 that can be configured to estimate one or more of gain differences or offset differences between the one or more filtered digital audio signals. In a non-limiting aspect, exemplary multipath digital audio combiner component 402 can be configured to employ the one or more of gain differences or offset differences to scale one or more of the one or more of filtered digital audio signals to provide a scaled digital audio signal, and can be configured to adjust offset associated with the one or more of filtered digital audio signals. As a non-limiting example, exemplary gain and offset estimation component 418 can be configured to utilize information in in_lo_raw[k] (414) and in_hi_raw[k] (416) to estimate the gain and/or offset differences between each of these signals (e.g., in_lo_raw[k] (414) and in_hi_raw[k] (416)). In a further non-limiting aspect, a gain difference estimate can be employed to form a gain_hi[k] (420) signal to facilitate scaling the in_hi_raw[k] signal (416), with the resulting in_hi_scaled[k] (422) signal then having a matched scale factor to the in_lo_raw[k] (414) signal. While for purposes of illustration, FIG. 4 is shown as facilitating the scaling the in_hi_raw[k] signal (416), in other non-limiting implementations, a scale factor can be applied in_lo_raw[k] (414) instead of or in addition to applying the scale factor gain_hi[k] (420) to the in_hi_raw[k] (416) signal.

In yet another non-limiting aspect, in addition to gain estimation, exemplary gain and offset estimation component 418 can be configured to utilize information in in_lo_raw[k] (414) and in_hi_raw[k] (416) to facilitate estimating offset differences, to facilitate adding offset_lo[k] (424) to in_lo_raw[k] (414) and facilitate adding offset_hi[k] (426) to in_hi_scaled[k] (422). It can be understood that exemplary offset_lo[k] (424) and exemplary offset_hi[k] (426) signals can be configured to correct for offset differences between the High SPL path (e.g., comprising exemplary preamplifier/gain stage 406 and exemplary ADC 410) and Low SPL path (e.g., comprising exemplary preamplifier/gain stage 404 and exemplary ADC 408), for example, during times that exemplary multipath digital audio combiner component 402 switches exemplary path combiner output, out[k], from conveying one of one or more of corrected digital audio signals (e.g., one of in_lo[k] (428) or in_hi[k] (430)) to conveying a second one of the one or more of corrected digital audio signals (e.g., the other of in_lo[k] (428) or in_hi[k] (430)).

For example, as further described in U.S. Pat. No. 9,673,768, for example, an exemplary MUX component 432 can be configured to switch from conveying one of one or more of corrected and/or scaled digital audio signals (e.g., one of in_lo[k] (428) or in_hi[k] (430)) to conveying a second one of the one or more of corrected digital audio signals (e.g., the other of in_lo[k] (428) or in_hi[k] (430)) based on one or more switching criteria determined by an exemplary multipath digital audio combiner component 402, for example, as further described below. As a non-limiting example, an exemplary MUX component 432 can be configured to switch from conveying one of one or more of corrected or scaled digital audio signals to conveying a second one of the one or more of corrected or scaled digital audio signals based on switching criteria comprising or associated with amplitude measurement, absolute value of the amplitude measurement, root-mean-square power measurement of digitized data associated with the one or more digital audio signals or one or more of the digital audio signals having a characteristic measurement above a threshold, for example, as further described herein.

Accordingly, exemplary path combiner component output, out[k], can be switched from conveying one of one or more of corrected or scaled digital audio signals (e.g., one of in_lo[k] (428) or in_hi[k] (430)) to conveying a second one of the one or more of corrected digital audio signals (e.g., the other of in_lo[k] (428) or in_hi[k] (430)) (e.g., switched from the Low SPL path, comprising exemplary preamplifier/gain stage 404 and exemplary ADC 408, to the High SPL path, comprising exemplary preamplifier/gain stage 406 and exemplary ADC 410), via exemplary MUX component 432 that is fed by the gain and offset corrected signals for each path, in_lo[k] (428) and in_hi[k] (430), and controlled by an exemplary in_hi_selected[k] signal (434). The details of how the in_hi_selected (434) signal is determined are further described in U.S. Pat. No. 9,673,768. However, according to further non-limiting aspects, non-limiting details of how exemplary MUX component 432 can be configured to be switched from conveying one of one or more of corrected or scaled digital audio signals (e.g., one of in_lo[k] (428) or in_hi[k] (430)) to conveying a second one of the one or more of corrected digital audio signals (e.g., the other of in_lo[k] (428) or in_hi[k] (430)) (e.g., switched from the Low SPL path, comprising exemplary preamplifier/gain stage 404 and exemplary ADC 408, to the High SPL path, comprising exemplary preamplifier/gain stage 406 and exemplary ADC 410), via exemplary MUX component 432 in the context of various disclosed embodiments is described below regarding FIG. 8.

As can be seen in FIG. 4, some benefits of employing multipath digital signal processing signal chains can include switching done completely in the digital domain, allowance of gain error correction and/or offset equalization, which allow for continuous calibration of gain/offset between paths to avoid artifacts, detection of zero crossing if desirable to facilitate switching with no glitches due to difference in signals, and if employing a capacitive based amplifier for a constant gain in preamp gain stage, further increases in power efficiency. However, it can be understood from FIG. 3 that employing multipath digital signal processing signal chains can comprise two or more signal paths, gain stages, and ADCs, larger die area and higher supply current, which can be mitigated by reduced noise requirements in the high SPL path, differences in noise levels in the signal paths which can result in audible artifacts when switching, if signal is not much higher than noise, and channel switching point limited (e.g., min. ~110 dB SPL) as a result of the increased gain in the low sound pressure level path and higher sensitivity of undesired signals (e.g., ultrasonic signals) activating high SPL Path with higher noise.

Thus, as described in FIG. 4 an exemplary dual-path system has proven to provide a very good and non-audible switching between the signal paths, if the signal magnitude and offset can be fully post-processed and controlled in the digital domain. The limiting factor for setting the switching threshold can be understood to be the difference in noise levels between the two signal paths (e.g., Low SPL path and High SPL path). For instance, if the signal level between the two paths is approximately 20 dB, then the noise levels between the two paths may be apart by approximately 20 dB. As described above, an AGC system can be configured to switch gain in lower steps (e.g., approximately 6 dB, etc.). This can be understood to imply that the difference in noise levels is much less significant as well. However, as further described above, the single path nature of the AGC based system does not allow to fully process and control the signal differences in the digital domain, thus small differences in signal magnitudes and offsets will be present, causing audible artifacts, that are very costly to remove in terms of chip area and power consumption.

Thus, according to various non-limiting embodiments, by combining multipath digital signal processing signal chain employing automatic gain control (AGC) at the gain stages, solutions can be designed that take advantages of the benefits of both while minimizing the negative impacts of either. Accordingly, in non-limiting aspects, various embodiments disclosed herein can employ a combination of multipath signal processing chains and AGC signal processing, where the digital signal processing blocks can be configured to correct for the signal amplitude and offset difference between the two signal paths (e.g., Low SPL path and High SPL path), yet the gain and noise level differences between the two paths can be kept very low (e.g., 6 dB), non-limiting aspects, in further, allowing to switch between the two paths at much lower sound pressure levels without audible switching artifacts. In a further non-limiting aspect, employing lower switching thresholds can further facilitate using filters and ADCs with significantly lower dynamic range, thus, saving a substantial amount of die area and reducing power consumption.

Figure 5:
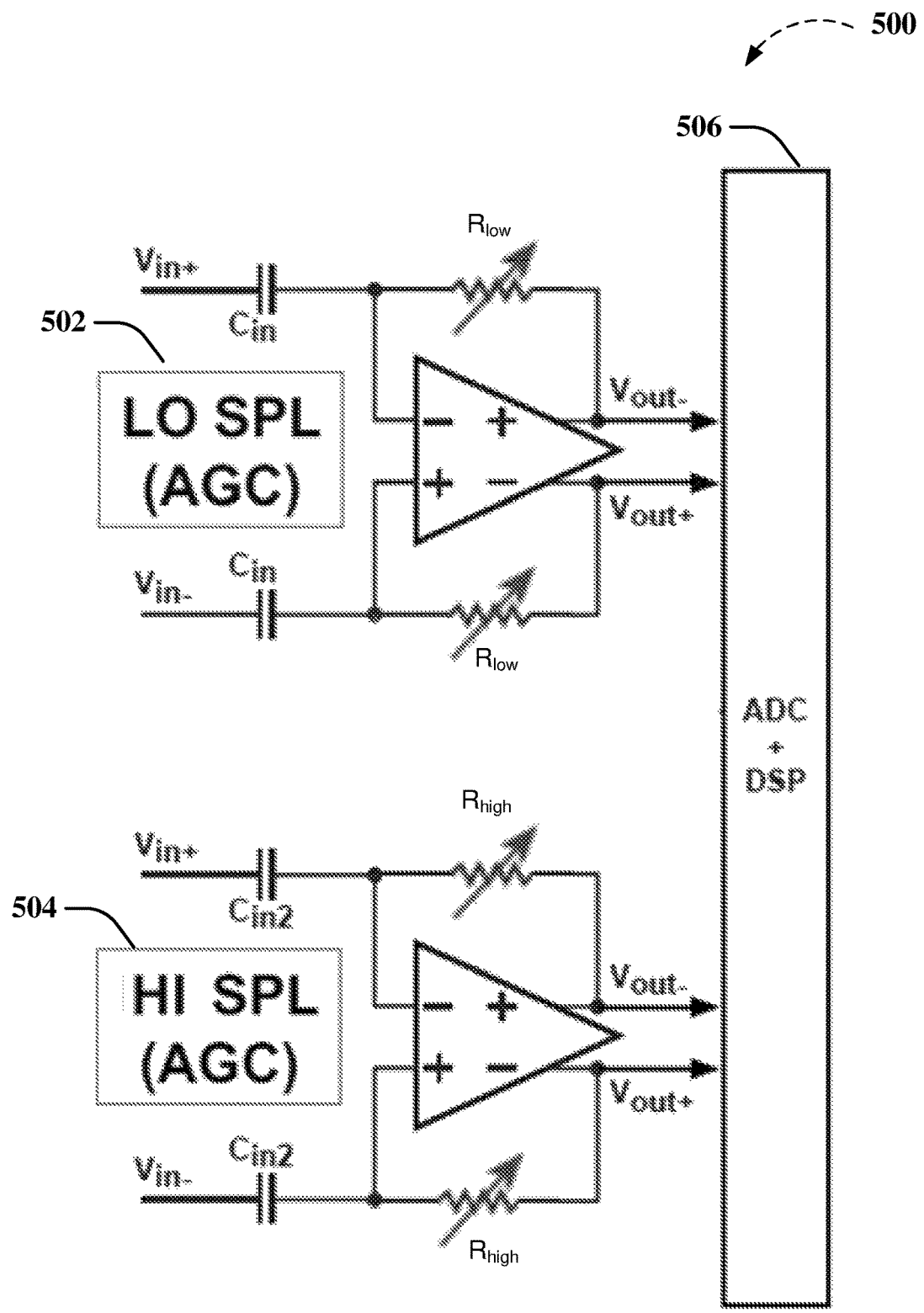
FIG. 5 depicts a non-limiting block diagram of exemplary aspects of automatic gain control in an exemplary embodiment of multipath digital signal processing signal chains, according to various non-limiting embodiments.

FIG. 5 depicts a non-limiting block diagram 500 of exemplary aspects of automatic gain control in an exemplary embodiment of multipath digital signal processing signal chains, according to various non-limiting embodiments. Various non-limiting embodiments as described herein can employ two or more signal paths (e.g., Low SPL path and High SPL path, etc.) that can comprise a low SPL AGC gain stage 502 and a high SPL AGC gain stage 504 as depicted in FIG. 5 and as further described herein regarding FIG. 3. In addition, further non-limiting embodiments as described herein can further comprise respective ADCs associated with the multipath digital signal processing signal chains (e.g., Low SPL path and High SPL path, etc.) and further digital signal processing 506, for example, as further described herein, regarding FIG. 4, or as further described below regarding FIGS. 6-8.

Thus, FIG. 5 depicts a simplified non-limiting block diagram of an exemplary embodiment of multipath digital signal processing signal chain with low and high SPL paths each employing exemplary aspects of automatic gain control, in further non-limiting aspects. A non-limiting embodiment can provide exemplary high performance digital microphones having a low SPL path that can achieve required SNR at 94 dB, with AGC functionality in the low SPL path, which allows extra 6 dB of preamp gain in low SPL path and dramatic power reduction in low SPL ADC, while avoiding gain switching at SPL levels near 94 dB, and having a high SPL path that can achieve high AOP that can be used when changing gain and at very high signal levels (e.g., above range of highest low SPL gain setting), with AGC functionality in the high SPL path, which allows matching of highpass corners for low and high paths.

Thus, according to various non-limiting embodiments, by combining multipath digital signal processing signal chain employing automatic gain control at the gain stages, benefits of employing multipath digital signal processing signal chains with AGC can include switching done completely in the digital domain, allowance of gain error correction and/or offset equalization, which allow for continuous calibration of gain/offset between paths to avoid artifacts, detection of zero crossing if desirable to facilitate switching with no glitches due to difference in signals, employing small gain steps (e.g., 6 dB steps) in AGC gain transitions such that digital gain compensation can mitigate or eliminate potential glitches, easy and fine digital gain adjustments, noise levels are ~6 dB apart, resulting in no audible artifacts due to much lower switching thresholds. However, it can be understood that combining multipath digital signal processing signal chain employing automatic gain control (AGC) at the gain stages can comprise two or more signal paths, gain stages, and ADCs, larger die area and higher supply current, which can be mitigated by channel switching point limited (e.g., below 100 dB SPL, 95 dB, etc.).

Figure 6:
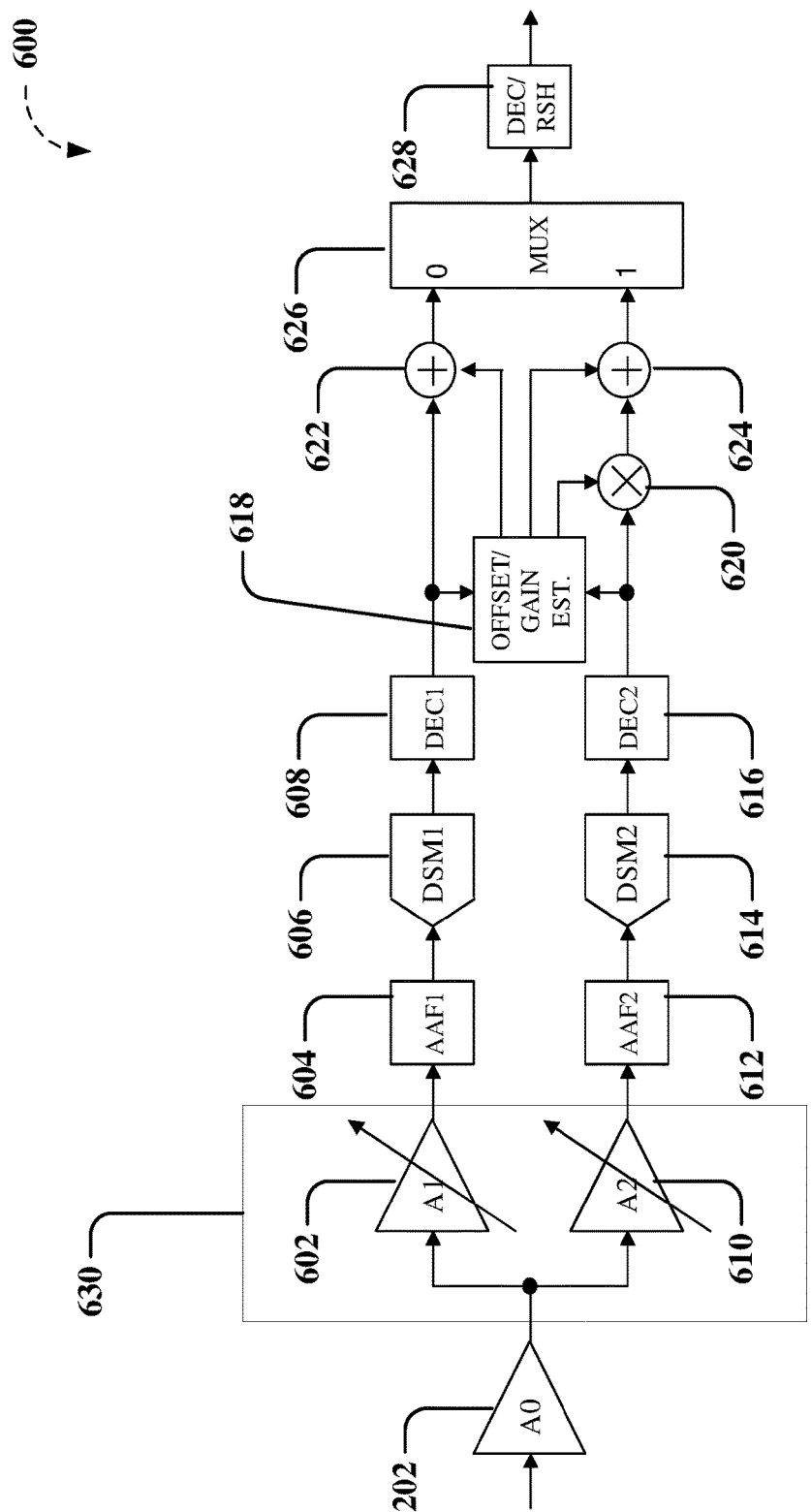
FIG. 6 depicts a non-limiting block diagram of exemplary aspects of automatic gain control in an exemplary embodiment of multipath digital signal processing signal chains, according to various non-limiting embodiments.

FIG. 6 depicts a non-limiting block diagram 600 of exemplary aspects of automatic gain control in an exemplary embodiment of multipath digital signal processing signal chains, according to various non-limiting embodiments. As non-limiting example, automatic gain control in an exemplary embodiment of multipath digital signal processing signal chains can comprise input buffer A0 202, for example, as described above regarding FIG. 2. In a further non-limiting aspect, automatic gain control in an exemplary embodiment of multipath digital signal processing signal chains can comprise a low SPL path comprising amplifier, gain stage or preamp A1 602, anti-aliasing filter (AAF1) 604, an ADC 606 such as a delta-sigma modulator (DSM1) 606, and a decimation filter (DEC1) 608, for example, as described above regarding FIG. 2. In another non-limiting aspect, automatic gain control in an exemplary embodiment of multipath digital signal processing signal chains can comprise a high SPL path comprising amplifier, gain stage or preamp A2 610, anti-aliasing filter (AAF2) 612, an ADC 614 such as a delta-sigma modulator (DSM2) 614, and a decimation filter (DEC2) 616, for example, as described above regarding FIG. 2. In yet another non-limiting aspect, amplifier, gain stage or preamp A1 602 and amplifier, gain stage or preamp A2 610 can be automatic gain controlled, for example, as further described above regarding FIGS. 3 and 5, and as further described herein.

Exemplary automatic gain control in an exemplary embodiment of multipath digital signal processing signal chains can further comprise a gain and offset estimation component 618, for example, as further described above regarding FIG. 4, wherein an exemplary multipath digital audio combiner component can comprise one or more gain adjustment components 620, and one or more offset adjustment components 622, 624, that can be configured to perform one or more of gain and/or offset correction in the multipath digital audio combiner component to provide a plurality of corrected digital audio signals (e.g., based in part on the gain determined by the AGC component). Automatic gain control in an exemplary embodiment of multipath digital signal processing signal chains can further comprise a multiplexing component (e.g., MUX 626), for example, as further described, regarding FIG. 4, that can be configured to switch from conveying one of the corrected digital audio signals to conveying a second one of the corrected digital audio signals, e.g., based on a comparison of a characteristic measurement of an audio signal (e.g., an audio signal in one or more of the signal processing chains) with a set of thresholds, for example, as further described herein, regarding FIG. 8. In another non-limiting aspect, automatic gain control in an exemplary embodiment of multipath digital signal processing signal chains can further comprise a multiplexing component (e.g., MUX 626), for example, as further described, regarding FIG. 4, that can be configured to switch from conveying one of the corrected digital audio signals to conveying a second one of the corrected digital audio signals, e.g., based on a comparison of a characteristic measurement of an audio signal (e.g., an audio signal in one or more of the signal processing chains) with a gain associated one or more attenuation components (not shown), in the signal processing chains, for example, as further described herein, regarding FIG. 7.

Automatic gain control in an exemplary embodiment of multipath digital signal processing signal chains can further comprise further digital signal processing components 628, e.g., such as decimators, reshapers, fitlters, and so on to provide a digital audio signal output, as further described herein. In addition, in a further non-limiting aspect, automatic gain control in an exemplary embodiment of multipath digital signal processing signal chains can further comprise an exemplary automatic gain control component configured to determine and adjust gain for each of the of amplifiers (e.g., amplifier, gain stage or preamp A1 602 and amplifier, gain stage or preamp A2 610) based on a characteristic measurement of the associated audio signal (e.g., an audio signal in one or more of the signal processing chains), in predetermined steps (e.g., 6 dB steps, etc.), for example, as further described herein, regarding FIGS. 3 and 5.

In a non-limiting example of automatic gain control in an exemplary embodiment of multipath digital signal processing signal chains, amplifier, gain stage or preamp A1 602 can be configured to have gain values of 42, 30, 18, 6 dB, and amplifier, gain stage or preamp A2 610 can be configured to have gain values of 36, 24, 12, 0 dB, wherein the low SPL path 0 can be selected with amplifier, gain stage or preamp A1 602 set to high gain (e.g., 42 dB), and wherein amplifier, gain stage or preamp A2 610 can be set to 36 dB. As further described herein, regarding FIG. 8, with increasing SPL, MUX 626 can be configured to switch to high SPL path 1, with amplifier, gain stage or preamp A2 610 gain set to 36 dB, and with amplifier, gain stage or preamp A1 602 adjusting to 30 dB. With further increasing SPL, MUX 626 can be configured to switch back to low SPL path 0, with amplifier, gain stage or preamp A1 602 adjusted to 30 dB with amplifier, and gain stage or preamp A2 610 gain adjusting to 24 dB. If the characteristic measurement (e.g., SPL) stays within the range, no change happens. Upon decreasing SPL, amplifier, gain stage or preamp A2 610 gain adjusts to 36 dB, MUX 626 can be configured to switch back to high SPL path 1. If the characteristic measurement (e.g., SPL) stays within the range, no change happens, in a further non-limiting aspect. With further decreasing SPL, MUX 626 can be configured to switch back to low SPL path 0, with amplifier, gain stage or preamp A1 602 adjusted to 42 dB with amplifier, and gain stage or preamp A2 610 gain set at 36 dB. This can be further understood by examination of the flowchart of FIG. 8 below.

Figure 7:
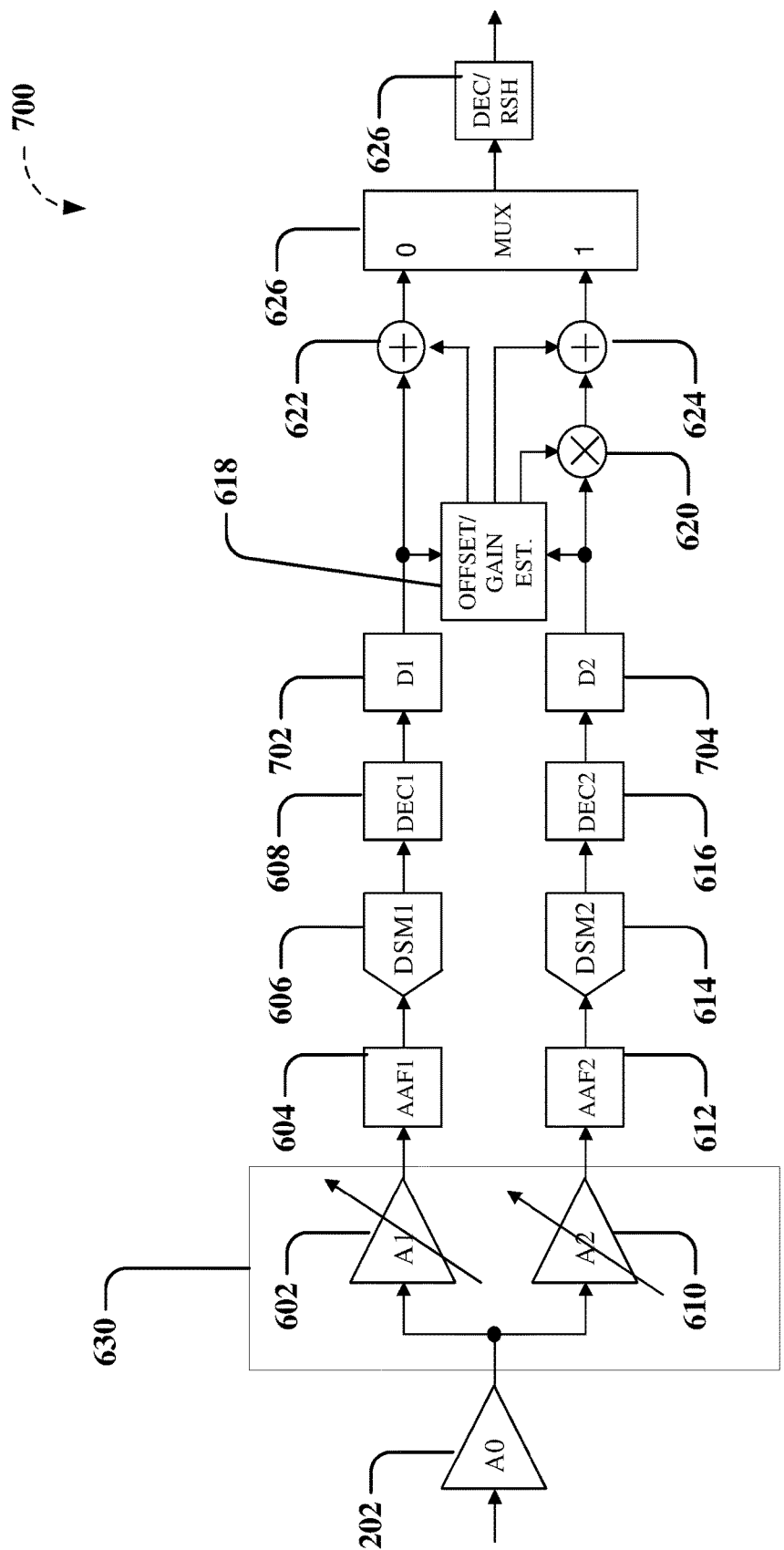
FIG. 7 depicts another non-limiting block diagram of exemplary aspects of automatic gain control in an exemplary embodiment of multipath digital signal processing signal chains, according to various non-limiting embodiments.

FIG. 7 depicts another non-limiting block diagram 700 of exemplary aspects of automatic gain control in an exemplary embodiment of multipath digital signal processing signal chains, according to various non-limiting embodiments. The description of components in FIG. 7 can be described as above regarding FIG. 6. Further non-limiting aspects of automatic gain control in an exemplary embodiment of multipath digital signal processing signal chains can be seen in FIG. 7 which can further comprise one or more exemplary attenuators D1 702 and D2 704. In a non-limiting aspect, an exemplary multipath digital audio combiner component, as described herein can further be configured to scale one or more digital audio signals (e.g., at the output of decimation filter (DEC1) 608, decimation filter (DEC2) 612, etc.) via one or more attenuation components D1 702 and D2 704, which can be configured to provide a course digital gain adjustment, to provide a plurality of scaled digital audio signals, e.g., based in part on the gain determined by the AGC component 630 and/or one or more attenuation components D1 702 and D2 704. In addition, an exemplary multipath digital audio combiner component comprising one or more gain adjustment components 620 can further provide a fine digital gain adjustment, to provide a plurality of scaled digital audio signals, e.g., based in part on the gain determined by the AGC component 630.

Figure 8:
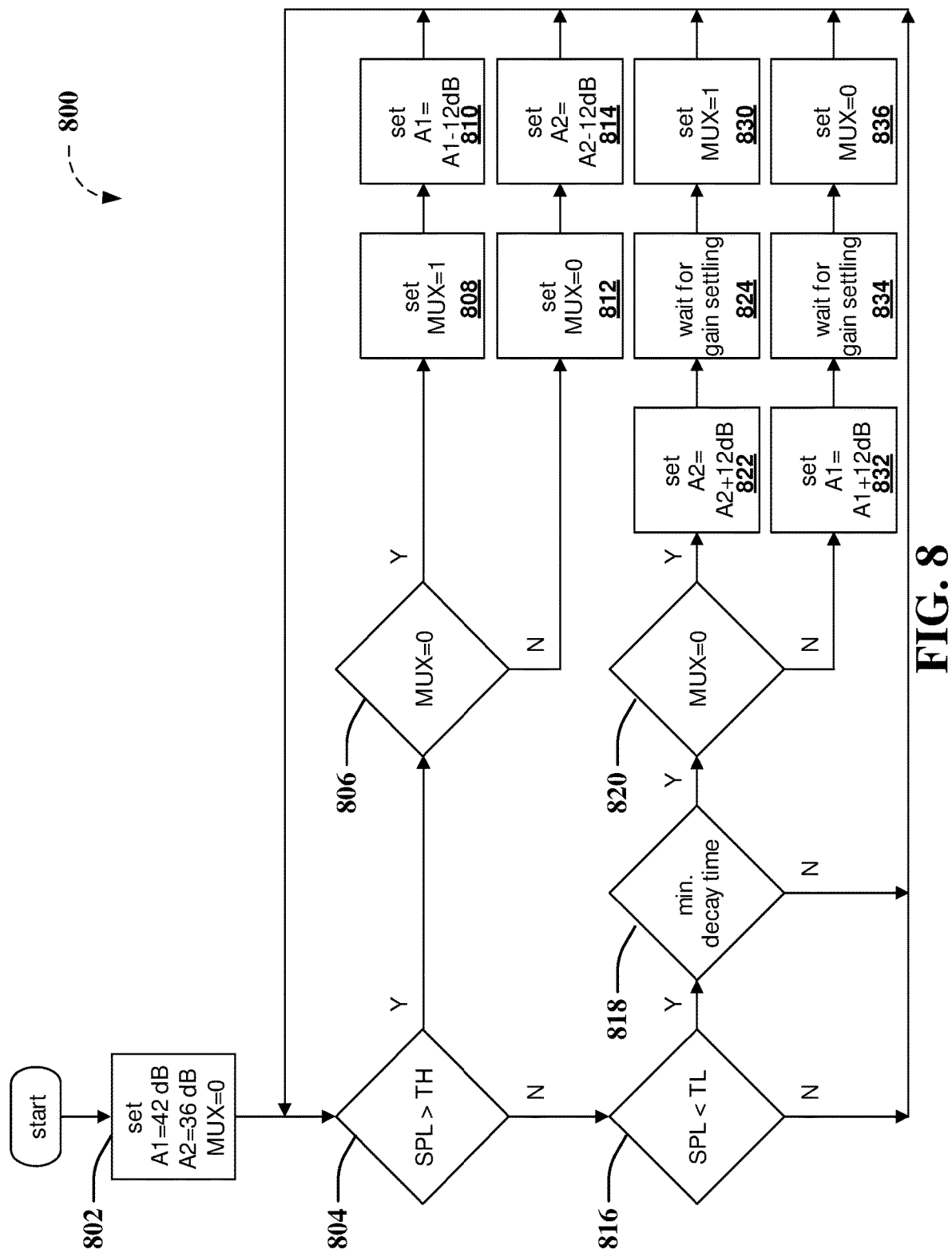
FIG. 8 depicts an exemplary flowchart illustrating non-limiting aspects of automatic gain control in an exemplary embodiment of multipath digital signal processing signal chains, according to various non-limiting embodiments.

FIG. 8 depicts an exemplary flowchart 800 illustrating non-limiting aspects of automatic gain control in an exemplary embodiment of multipath digital signal processing signal chains, according to various non-limiting embodiments. For instance, as described above regarding FIG. 6, in a non-limiting example of automatic gain control in an exemplary embodiment of multipath digital signal processing signal chains, amplifier, gain stage or preamp A1 602 can be configured to have gain values of 42, 30, 18, 6 dB, and amplifier, gain stage or preamp A2 610 can be configured to have gain values of 36, 24, 12, 0 dB, wherein path 0 can be selected with amplifier, gain stage or preamp A1 602 set to high gain (e.g., 42 dB), and wherein amplifier, gain stage or preamp A2 610 can be set to 36 dB, at 802. As further described herein, with increasing SPL (e.g., characteristic measurement greater than a high threshold (804)), MUX 626 (at 806) can be configured to switch to path 1 at 808, with amplifier, gain stage or preamp A2 610 gain set to 36 dB, and with amplifier, gain stage or preamp A1 602 adjusting to 30 dB, at 810. With further increasing SPL, MUX 626 (at 806) can be configured to switch back to path 0 (at 812), with amplifier, gain stage or preamp A1 602 adjusted to 30 dB with amplifier, and gain stage or preamp A2 610 gain adjusting to 24 dB (at 814). If the characteristic measurement (e.g., SPL) stays within the range, no change happens.

Upon decreasing SPL (e.g., characteristic measurement less than a low threshold (816)), then after a minimum decay time at 818, and with MUX 626 at path 0 (at 820), amplifier, gain stage or preamp A2 610 gain adjusts to 36 dB (at 822), and MUX 626 can be configured to switch after awaiting gain setting at 824, back to path 1, at 830. If the characteristic measurement (e.g., SPL) stays within the range, no change happens, in a further non-limiting aspect. With further decreasing SPL, then after a minimum decay time at 818, and with MUX 626 at path 1 (at 820), amplifier, gain stage or preamp A1 602 can be adjusted to 42 dB, and MUX 626 can be configured to switch after awaiting gain sitting at 832 back to path 0, with amplifier, and gain stage or preamp A2 610 gain set at 36 dB.

Accordingly, various non-limiting embodiments of disclosed subject matter can provide systems, methods, and devices for automatic gain control multipath digital audio signal processing chains.

Various non-limiting embodiments described herein can comprise a multipath digital audio combiner component that can be configured for automatic gain control in multipath digital audio signal digital signal processing chains.

As a non-limiting example, an exemplary multipath digital audio combiner component can comprise one or more digital audio filters operatively coupled to one or more ADCs and configured to receive one or more digital audio signals having different scaling factors of an associated audio signal and configured to provide one or more filtered digital audio signals, in a non-limiting aspect. For instance, the exemplary one or more digital audio filters comprise at least one of one or more decimators or one or more low pass filters, as further described herein.

In a further non-limiting example, an exemplary multipath digital audio combiner component can further comprise one or more amplifiers configured to generate one or more analog audio signals associated with the one or more digital audio signals having different scaling factors, in another non-limiting aspect.

In addition, an exemplary multipath digital audio combiner component can further comprise an AGC component configured to determine and adjust gain for each of the one or more amplifiers based in part on a characteristic measurement of the associated audio signal, as further described herein. In a non-limiting example, an exemplary AGC component can be further configured to adjust gain for each of the one or more amplifiers in predetermined gain steps, as further described herein. In a further non-limiting aspect, exemplary AGC component can be further configured to adjust gain for each of the one or more amplifiers in predetermined gain steps of approximately 6 dB gain steps.

In another non-limiting example, an exemplary multipath digital audio combiner component can comprise a gain and offset estimation component configured to estimate at least one of gain differences or offset differences between the one or more filtered digital audio signals, in yet another non-limiting aspect. For instance, an exemplary gain and offset estimation component can be further configured to perform at least one of a least squares estimation or a correlation-based estimation of the at least one of gain differences or offset differences, as further described herein. In further embodiments, gain and offset estimation component can be further configured to estimate the at least one of gain differences or offset differences on a continuous basis to account for temperature variations, in a non-limiting aspect.

As a non-limiting example, an exemplary multipath digital audio combiner component can further comprise a multiplexing component configured to switch from conveying one of one or more corrected digital audio signals to conveying a second one of the one or more corrected digital audio signals, wherein the multipath digital audio combiner component is further configured to perform gain and offset correction for the one or more filtered digital audio signals to provide the one or more corrected digital audio signals based at least in part on the gain determined by the AGC component, as further described herein.

In still further non-limiting embodiments, exemplary multipath digital audio combiner component can be further configured to employ the offset differences to adjust offset associated with the one or more scaled digital audio signals, in another non-limiting aspect.

In still another non-limiting aspect, exemplary multipath digital audio combiner component can be further configured to scale the one or more filtered digital audio signals via one or more attenuation components to provide one or more scaled digital audio signals based at least in part on the gain determined by the AGC component and at least one of the one or more attenuation components. For instance, addition, in still further non-limiting embodiments, an exemplary multipath digital audio combiner component can be further configured to control the multiplexing component to switch from conveying the one of the one or more corrected digital audio signals to conveying the second one of the one or more corrected digital audio signals based on at least one of a comparison of the characteristic measurement of the associated audio signal with a set of thresholds or a gain associated with the at least one of the one or more attenuation components.

In addition, an exemplary multipath digital audio combiner component can be further configured to control the multiplexing component to switch from conveying the one of the one or more corrected digital audio signals to conveying the second one of the one or more corrected digital audio signals based on the characteristic measurement associated with sound pressure level based on at least one of amplitude measurement, absolute value of the amplitude measurement, or root-mean-square power measurement of digitized data associated with the one or more filtered digital audio signals, in still further non-limiting embodiments. In a further non-limiting aspect, exemplary embodiments can comprise a multipath digital audio combiner component that can be further configured to control the multiplexing component to switch from conveying the one of the one or more corrected digital audio signals to conveying the second one of the one or more corrected digital audio signals after a predetermined decay time based on the characteristic measurement.

Figure 9:
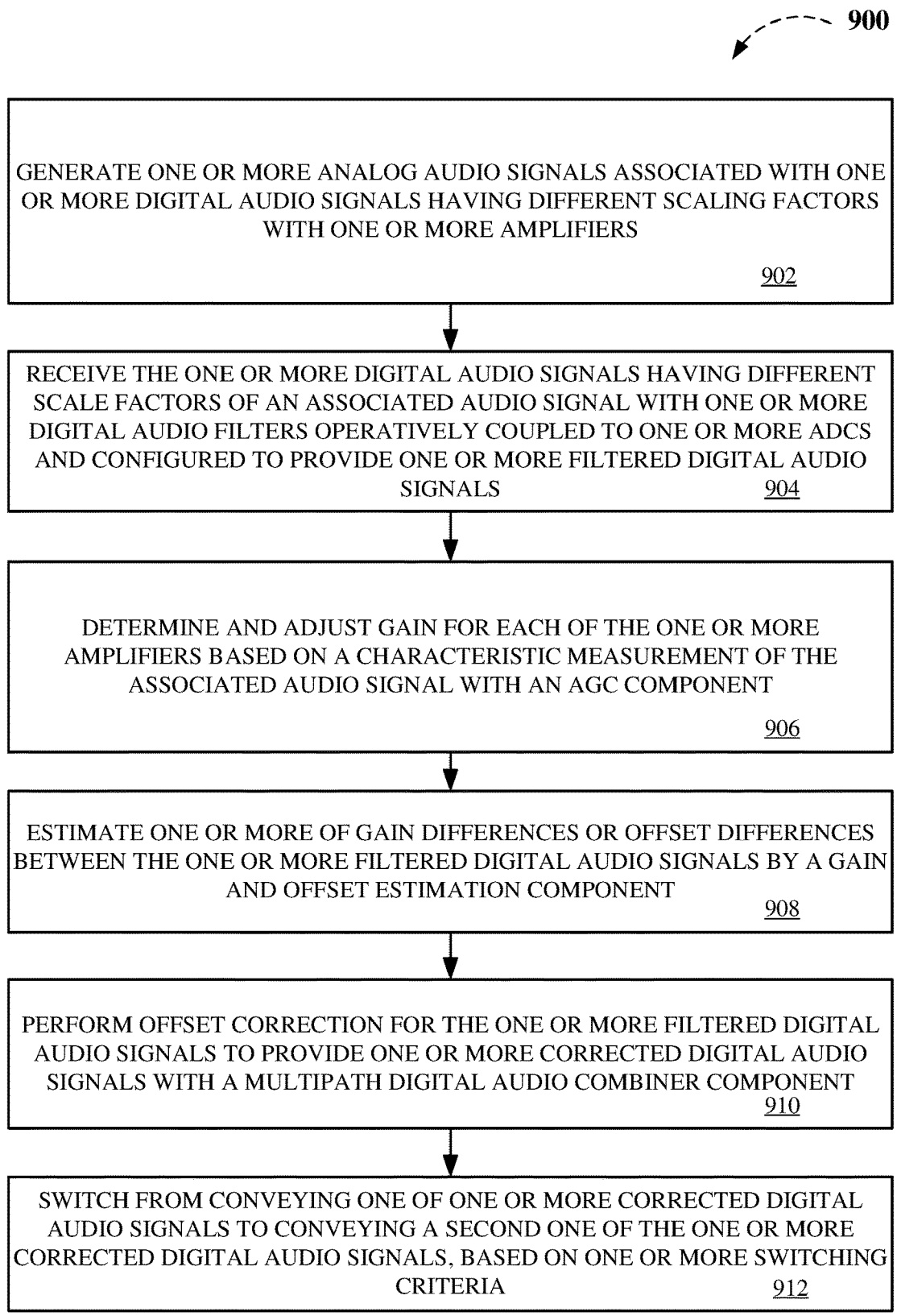
FIG. 9 depicts an exemplary flowchart of non-limiting methods associated with a various non-limiting embodiments of the subject disclosure.

In view of the subject matter described supra, methods that can be implemented in accordance with the subject disclosure will be better appreciated with reference to the flowchart of FIG. 9. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 9 depicts an exemplary flowchart of non-limiting methods 1200 associated with various non-limiting embodiments of the subject disclosure. For example, at 902, exemplary methods 900 can comprise generating one or more analog audio signals associated with one or more digital audio signals having different scaling factors with one or more amplifiers, in a non-limiting aspect. In another non-limiting example, at 904, exemplary methods 900 can comprise receiving the one or more digital audio signals having different scale factors of an associated audio signal with one or more digital audio filters operatively coupled to one or more ADCs and configured to provide one or more filtered digital audio signals, as further described herein. As a non-limiting example, receiving the one or more digital audio signals with the one or more digital audio filters can further comprise receiving the one or more digital audio signals with one or more of one or more decimators or one or more low pass filters, as further described above.

In yet another non-limiting example, at 906, exemplary methods 900 can comprise determining and adjusting gain for each of the one or more amplifiers based on a characteristic measurement of the associated audio signal with an AGC component, in a further non-limiting aspect. As a non-limiting example, the determining and the adjusting gain for each of the one or more amplifiers can further comprise determining and adjusting gain for each of the one or more amplifiers in predetermined gain steps, as further described herein. For instance, determining and the adjusting gain for each of the one or more amplifiers in predetermined gain steps can further comprise determining and the adjust gain for each of the one or more amplifiers in predetermined gain steps comprising a multiple of 6 dB gain steps.

As a further example, at 908, exemplary methods 900 can comprise estimating one or more of gain differences or offset differences between the one or more filtered digital audio signals by a gain and offset estimation component, in a non-limiting aspect. As a non-limiting example, exemplary methods 900 can further comprise estimating one or more of gain differences or offset differences by the gain and offset estimation component via performing one or more of a least squares estimation or a correlation-based estimation of the one or more of gain differences or offset differences, as further described herein. In addition, exemplary methods 900 can further comprise estimating the one or more of gain differences or offset differences on a continuous basis to account for temperature variations, in a further non-limiting aspect.

In addition, exemplary methods 900 can comprise, at 910, performing offset correction for the one or more filtered digital audio signals to provide one or more corrected digital audio signals with a multipath digital audio combiner component, in various embodiments described herein.

At 912, exemplary methods 900 can comprise switching from conveying one of one or more corrected digital audio signals to conveying a second one of the one or more corrected digital audio signals, based on one or more switching criteria, in still further non-limiting aspects. For instance, switching based on one or more switching criteria can comprise switching based on one or more of a comparison of the characteristic measurement of the associated audio signal with a set of thresholds or a gain associated with the one or more of the one or more attenuators. In another non-limiting example, switching based on the one or more switching criteria can further comprise switching based on one or more of a comparison of the characteristic measurement of the associated audio signal with a set of thresholds or a gain associated with the one or more of the one or more attenuators. In addition, in a further non-limiting aspect, switching based on the one or more switching criteria can comprise switching based on the characteristic measurement associated with sound pressure level based on one or more of amplitude measurement, absolute value of the amplitude measurement, or root-mean-square power measurement of digitized data associated with the one or more filtered digital audio signals, as further described herein. In another non-limiting aspect, switching based on the one or more switching criteria can further comprise switching after a predetermined decay time based on the characteristic measurement.

In addition, exemplary methods 900 can further comprise, scaling the one or more filtered digital audio signals via one or more attenuators to provide one or more scaled digital audio signals based in part on the gain determined by the AGC component and one or more of the one or more attenuators, still further non-limiting aspects.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

As used in this application, the terms "component," "module," "device" and "system" are intended to refer to a computer-related entity, either hardware, a combination of hardware and software, software, or software in execution. As one example, a component or module can be, but is not limited to being, a process running on a processor, a processor or portion thereof, a hard disk drive, multiple storage drives (of optical and/or magnetic storage medium), an object, an executable, a thread of execution, a program, and/or a computer. By way of illustration, both an application running on a server and the server can be a component or module. One or more components or modules scan reside within a process and/or thread of execution, and a component or module can be localized on one computer or processor and/or distributed between two or more computers or processors.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. An apparatus, comprising:
a multipath digital signal combiner component comprising:
a plurality of digital filters operatively coupled to a plurality of analog-to-digital converters (ADCs) and configured to receive a plurality of digital signals having different scaling factors of an associated input signal and configured to provide a plurality of filtered digital signals;
a plurality of amplifiers configured to generate a plurality of analog signals associated with the plurality of digital signals having different scaling factors;
an automatic gain control (AGC) component configured to determine and adjust gain for each of the plurality of amplifiers based in part on a characteristic measurement of the associated input signal;

a gain and offset estimation component configured to estimate at least one of gain differences or offset differences between the plurality of filtered digital signals; and a multiplexing component configured to switch from conveying one of a plurality of corrected digital signals to conveying a second one of the plurality of corrected digital signals, wherein the multipath digital signal combiner component is further configured to perform gain and offset correction for the plurality of filtered digital signals to provide the plurality of corrected digital signals based at least in part on the gain determined by the AGC component.

2. The apparatus of claim 1, wherein the multipath digital signal combiner component is further configured to employ the offset differences to adjust offset associated with the plurality of scaled digital signals.

3. The apparatus of claim 1, wherein the multipath digital signal combiner component is further configured to scale the plurality of filtered digital signals via a plurality of attenuation components to provide a plurality of scaled digital signals based at least in part on the gain determined by the AGC component and at least one of the plurality of attenuation components.

4. The apparatus of claim 3, wherein the multipath digital signal combiner component is further configured to control the multiplexing component to switch from conveying the one of the plurality of corrected digital signals to conveying the second one of the plurality of corrected digital signals based on at least one of a comparison of the characteristic measurement of the associated input signal with a set of thresholds or a gain associated with the at least one of the plurality of attenuation components.

5. The apparatus of claim 1, wherein the multipath digital signal combiner component is further configured to control the multiplexing component to switch from conveying the one of the plurality of corrected digital signals to conveying the second one of the plurality of corrected digital signals based on the characteristic measurement associated with the level of the associated input signal based on at least one of amplitude measurement, absolute value of the amplitude measurement, or root-mean-square power measurement of digitized data associated with the plurality of filtered digital signals.

6. The apparatus of claim 1, wherein the multipath digital signal combiner component is further configured to control the multiplexing component to switch from conveying the one of the plurality of corrected digital signals to conveying the second one of the plurality of corrected digital signals after a predetermined decay time based on the characteristic measurement.

7. The apparatus of claim 1, wherein the gain and offset estimation component is further configured to perform at least one of a least squares estimation or a correlation-based estimation of the at least one of gain differences or offset differences.

8. The apparatus of claim 1, wherein the gain and offset estimation component is further configured to estimate the at least one of gain differences or offset differences on a continuous basis to account for temperature variations.

9. The apparatus of claim 1, wherein the plurality of digital filters comprise at least one of a plurality of decimators or a plurality of low pass filters.

10. The apparatus of claim 1, wherein the AGC component is further configured to adjust gain for each of the plurality of amplifiers in predetermined gain steps.

11. The apparatus of claim 10, wherein the predetermined gain steps comprise a multiple of 6 deciBel (dB) gain steps.

12. A method, comprising:
generating a plurality of analog signals associated with a plurality of digital signals having different scaling factors with a plurality of amplifiers;
receiving the plurality of digital signals having different scaling factors of an associated input signal with a plurality of digital filters operatively coupled to a plurality of analog-to-digital converters (ADCs) and configured to provide a plurality of filtered digital signals;
determining and adjusting gain for each of the plurality of amplifiers based in part on a characteristic measurement of the associated input signal with an automatic gain control (AGC) component;
estimating at least one of gain differences or offset differences between the plurality of filtered digital signals by a gain and offset estimation component;
performing offset correction for the plurality of filtered digital signals to provide a plurality of corrected digital signals with a multipath digital signal combiner component; and
switching from conveying one of a plurality of corrected digital signals to conveying a second one of the plurality of corrected digital signals, based on at least one switching criteria.

13. The method of claim 12, further comprising:
scaling the plurality of filtered digital signals via a plurality of attenuators to provide a plurality of scaled digital signals based at least in part on the gain determined by the AGC component and at least one of the plurality of attenuators.

14. The method of claim 13, wherein the switching based on the at least one switching criteria comprises switching based on at least one of a comparison of the characteristic measurement of the associated input signal with a set of thresholds or a gain associated with the at least one of the plurality of attenuators.

15. The method of claim 12, wherein the switching based on the at least one switching criteria comprises switching based on the characteristic measurement associated with the level of the associated input signal based on at least one of amplitude measurement, absolute value of the amplitude measurement, or root-mean-square power measurement of digitized data associated with the plurality of filtered digital signals.

16. The method of claim 12, wherein the switching based on the at least one switching criteria comprises switching after a predetermined decay time based on the characteristic measurement.

17. The method of claim 12, wherein the estimating at least one of gain differences or offset differences by the gain and offset estimation component comprises performing at least one of a least squares estimation or a correlation-based estimation of the at least one of gain differences or offset differences.

18. The method of claim 12, wherein the receiving the plurality of digital signals with the plurality of digital filters comprises receiving the plurality of digital signals with at least one of a plurality of decimators or a plurality of low pass filters.

19. The method of claim 12, further comprising:
estimating the at least one of gain differences or offset differences on a continuous basis to account for temperature variations.

20. The method of claim 12, wherein the determining and the adjusting gain for each of the plurality of amplifiers comprises determining and adjusting gain for each of the plurality of amplifiers in predetermined gain steps.

21. The method of claim 20, wherein the determining and the adjusting gain for each of the plurality of amplifiers in predetermined gain steps comprises determining and the adjusting gain for each of the plurality of amplifiers in predetermined gain steps comprising a multiple of 6 deciBel (dB) gain steps.

22. The apparatus of claim 1, wherein the associated input signal is an audio signal.

23. The apparatus of claim 1, wherein the associated input signal is an acoustic signal.

24. The apparatus of claim 5, wherein the characteristic measurement is associated with sound pressure level.

25. The method of claim 12, wherein the associated input signal is an audio signal.

26. The method of claim 12, wherein the associated input signal is an acoustic signal.

27. The method of claim 15, wherein the switching comprises switching based on the characteristic measurement associated with sound pressure level of the associated input signal based on the at least one of the amplitude measurement, the absolute value of the amplitude measurement, or the root-mean-square power measurement of the digitized data associated with the plurality of filtered digital signals.

\* \* \* \* \*